United States Patent [19]
Huggins et al.

[11] Patent Number: 5,985,518
[45] Date of Patent: Nov. 16, 1999

[54] METHOD OF CUSTOMIZING INTEGRATED CIRCUITS USING STANDARD MASKS AND TARGETING ENERGY BEAMS

[75] Inventors: Alan H. Huggins, Gilroy; John MacPherson, Fremont, both of Calif.

[73] Assignee: Clear Logic, Inc., Santa Clara, Calif.

[21] Appl. No.: 08/823,778

[22] Filed: Mar. 24, 1997

[51] Int. Cl.$^6$ ........................................................ G03F 7/00
[52] U.S. Cl. .......................... 430/312; 430/318; 430/394
[58] Field of Search ..................................... 430/312, 394, 430/396, 318

[56] References Cited

U.S. PATENT DOCUMENTS

| | | | |
|---|---|---|---|
| 4,689,657 | 8/1987 | Percival et al. | 357/68 |
| 4,691,434 | 9/1987 | Percival et al. | 437/173 |
| 4,875,971 | 10/1989 | Orbach et al. | 156/644 |
| 4,960,729 | 10/1990 | Orbach et al. | 437/101 |
| 5,166,556 | 11/1992 | Hsu et al. | 307/465 |
| 5,314,840 | 5/1994 | Schepis et al. | 437/194 |
| 5,404,033 | 4/1995 | Wong et al. | 257/202 |
| 5,702,868 | 12/1997 | Kellam et al. | 430/312 |

*Primary Examiner*—John A. McPherson
*Attorney, Agent, or Firm*—Skjerven, Morrill, MacPherson, Franklin & Friel, LLP; Tom Chen

[57] ABSTRACT

A method for fabricating custom integrated circuits includes the steps of 1) patterning the layer to be customized with standard precision masking techniques to define all possible connections, vias or cut-points, and 2) using a non-precision targeting energy beam to select the desired connections, vias or cut-points for customization. Consequently, the present invention requires no custom mask so that application specific integrated circuits (ASICs) can be produced with lower lead-time and costs when compared to prior methods. In other embodiments, a non-precision configuration mask may replace the targeting energy beam, where the configuration mask can be made by conventional mask-making techniques or by applying an opaque layer to a mask blank and using a targeting energy beam to selectively remove the desired portions of the opaque areas.

11 Claims, 7 Drawing Sheets

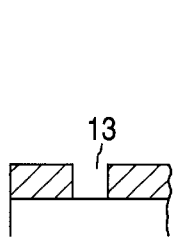
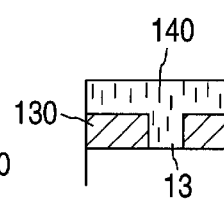
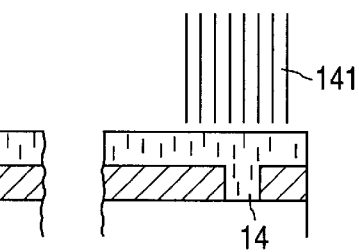
FIG. 13  FIG. 14
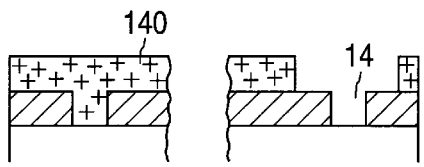
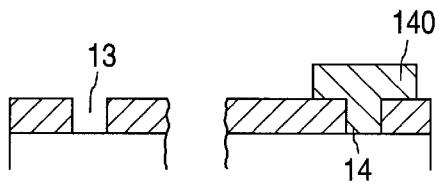
FIG. 15  FIG. 16
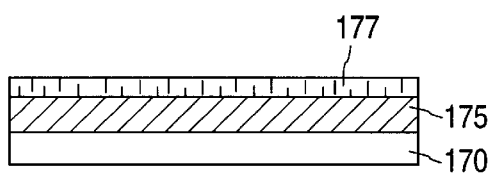
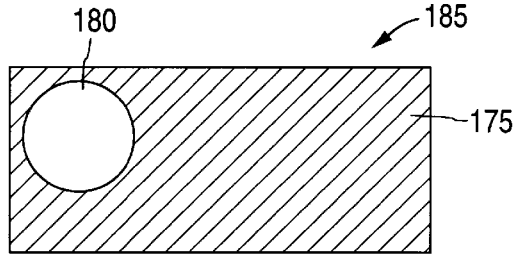
FIG. 17  FIG. 18A
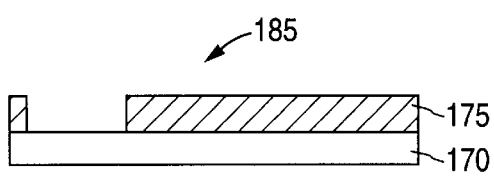
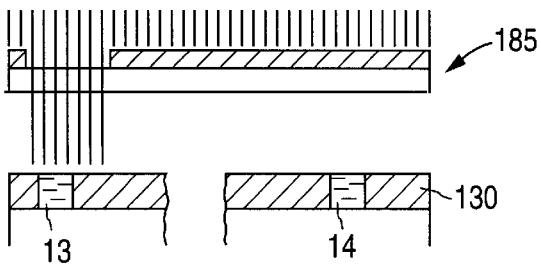
FIG. 18B  FIG. 19

METHOD OF CUSTOMIZING INTEGRATED CIRCUITS USING STANDARD MASKS AND TARGETING ENERGY BEAMS

FIELD OF THE INVENTION

The present invention relates to methods of patterning photoresist, and more particularly to methods for combining precision and non-precision photolithography processes to customize integrated circuits.

BACKGROUND OF THE INVENTION

Custom or application specific-integrated circuits (ASICs) are frequently used to implement new circuit designs. The fabrication process for an integrated circuit (IC) includes the following basic steps:

1) form a layer of conductive or insulative material on the upper surface of a silicon or semiconductor wafer;
2) coat the surface of the wafer with a photoresist (positive or negative), which is then cured and dried;
3) expose the photoresist to an intense light source through a precision mask to define specific patterns on the wafer;
4) develop the resist to remove portions not selected by irradiation through the mask (exposed portions if a positive resist is used, unexposed portions if a negative resist is used);
5) etch away the portion of the layer exposed by the removed portions of the resist;
6) remove the remaining resist;
7) repeat steps 1–6 for each layer formed on the IC.

One consequence of this fabrication process is that several precision custom masks may be required for each IC. Because precision custom masks are costly to manufacture, a large quantity of each IC must be produced in order for the fabrication process to be economical. However, as technology advances, circuit designs become more application-specific and are typically required at a much lower volume than the more generic ICs, thus making fabrication of such application-specific ICs more expensive. This need for lower cost per unit ASICs and other needs of the ASIC manufacturer and user are not being met with the conventional fabrication process.

The objectives of the ASIC user and manufacturer fall into four primary categories. One objective is the ability to feasibly manufacture a small number of prototype units (i.e., one or two units). This keeps design costs low because only the required number of test units are manufactured, thereby saving costs for unused and unneeded units. A second objective is to minimize the costs of each iterated test unit because a single application may require numerous prototype units for testing and modification. A third objective for the ASIC user is to reduce the lead-time to produce both prototype and production units in order for the design to be quickly developed and placed into production as soon as possible, thereby shortening the time-to-market schedule for the final circuit design. A fourth objective is to minimize costs for both prototype and production units, regardless of the number manufactured.

In an attempt to meet these objectives, a current practice is to use gate arrays to customize integrated circuits. Gate arrays are mass-produced integrated circuits containing generic arrays of circuit elements ("gate array blanks"), which can be customized into application-specific ICs with a small number of masks defining custom interconnections of the circuit elements at the final steps of fabrication. The gate array blanks can be manufactured up to the customization steps and stored away until an order for a particular application-specific circuit is received.

Typically, in a two-layer metal technology, customizing the gate array blank requires processing three layers: a first metal layer, an insulation layer, and a second metal layer, in that order. The basic steps are as follows:

1) deposit the first metal layer on a contact layer, which connects the first metal layer to the circuit elements below;
2) coat the first metal layer with resist, which is then cured and dried;
3) expose the resist through an application-specific mask;
4) develop the resist to remove the unwanted portions of the resist, i.e., the desired electrical connection portions;
5) etch the uncovered portions of the first metal layer;
6) remove the remaining resist;
7) deposit the insulation layer on the first metal layer;
8) coat the insulation layer with resist, which is then cured and dried;
9) expose the resist through another custom mask;
10) develop the resist and remove the unwanted portions;
11) etch the uncovered portions of the insulation layer to form openings ("vias") in the insulation layer for connecting the first and second metal layers;
12) remove the remaining resist;
13) deposit the second metal layer on the insulation layer allowing the deposited metal to fill the vias;
14) coat the second metal layer with resist, which is then cured and dried;
15) expose the resist through another custom mask;
16) develop the resist to remove the unwanted portions;
17) etch the uncovered portions of the second metal layer;
18) remove the remaining resist;
19) deposit a passivation layer on the second metal layer; and
20) configure the passivation layer using a general purpose mask to provide connections to the ASIC thus formed.

Therefore, gate array processing reduces cost and lead-time to manufacture ASICS. However, even though gate array processing meets portions of the third and fourth objectives, the other objectives are not met due to the high costs of precision configuration masks. Furthermore, the need for precision configuration masks limits the extent that costs and lead-time can be reduced.

An alternative method is to use direct write-on-wafer technology on gate array processing to replace the steps requiring custom configuration masks. However, using programmable direct-write machines can still incur substantial costs to the manufacture of prototype and production ASICs. Electron beam (E-beam) direct-write technology employs high-cost equipment with a low throughput. On the other hand, laser-based direct-write systems do not have the resolution needed to meet the performance and total die size requirements of present designs. Even though less expensive than E-beam systems, laser based systems are still more expensive and of lower precision than standard optical reduction steppers or other comparable methods using a standard set of precision photo-masks.

Accordingly, it is desirable to have a fabrication process for customizing integrated circuits without the drawbacks of conventional methods for reducing both lead-time and costs of designing and manufacturing ASICS.

SUMMARY OF THE INVENTION

According to the present invention, a method is provided for customizing integrated circuits by combining precision and non-precision lithography without the need of a precision configuration mask, thereby reducing costs, complexity, and lead-time for fabricating an application specific integrated circuit (ASIC).

In an embodiment of the present invention for patterning photoresist openings, negative photoresist is applied to a wafer or other structure. The resist is exposed through a precision mask or by other precision techniques in all areas except where possible openings will exist. The size, location, and shape of the possible openings are determined by the precision mask. A laser direct-write machine or other non-precision direct-write technique (hereinafter referred generally as "laser") is then used to expose areas, typically larger than the openings, which are not to be subsequently acted upon. The resist is then developed to uncover the openings not selected by either the mask or laser, i.e., the logical NOR of the mask opening areas and the laser spots. The device may then be etched or acted upon through these openings.

In another embodiment for patterning photoresist openings, positive resist is used to coat the device. The resist is exposed at all possible openings through a precision mask, which defines the size and shape of the possible openings. However, the time and energy of the precision mask exposure is kept below the threshold for complete exposure of the resist, which is generally referred to as the clearing energy of the resist. A laser then exposes locations on the resist overlapping areas where openings are desired. The time and energy of the laser exposure is insufficient to fully expose the resist by itself, but is sufficient when combined with the mask exposure step. The resist is then developed to uncover openings exposed by both the mask and laser, i.e., the logical AND of the two exposure steps. The device can then be etched or acted upon based on the resist pattern.

In another embodiment of the present invention, lines and specific locations of potential cut points for disconnecting the lines are patterned on a positive resist layer. The resist is exposed through a standard precision mask to define lines (unexposed) and spaces (exposed). A laser then exposes selected cut points within the lines and the resist is developed to uncover areas exposed by the mask or the laser, i.e., a logical OR of the mask open areas and laser patterns. The device may then be etched or acted upon accordingly.

Another embodiment of the present invention patterns lines with possible connection points between lines on negative photoresist. The resist is exposed through a precision mask to define lines (exposed) where the resist is to cover the structure and gaps (unexposed) where the resist is to be removed. A laser exposes additional areas between lines where resist is desired to cover the structure, creating selected additional connections between lines. The resist is developed and areas of the resist left unexposed by the mask or laser are removed for a logical OR of the mask and laser patterns. Etching or other processing can then be performed on the patterned resist.

In another embodiment of the present invention, two resist layers are used to pattern a device. A first layer of positive or negative resist is deposited on the device. The first layer is exposed through a precision mask (with corresponding changes in the mask polarity depending on the resist polarity) to define the dimensions of the pattern. The resist is then developed to remove the desired resist areas. A second layer of resist (positive or negative) is applied over the first resist and portions of the device uncovered by the precision mask exposure. A laser (with corresponding changes to the write pattern depending on the resist polarity) selects the portions on the second resist layer, which are then developed to uncover the desired areas of the device for etching or other processing.

In the above embodiments, a laser beam is used to select the desired patterning. Irradiation through a non-precision configuration mask can replace the non-precision direct-write step. The configuration mask can be made by first applying an opaque layer onto a mask blank and then depositing a resist layer over the opaque layer. The laser beam then exposes portions of resist over the opaque layer, and desired areas of the mask are removed through conventional mask-making methods. Alternatively, a laser can remove desired opaque areas by direct ablation. Furthermore, a configuration mask can be modified by removing additional opaque areas or re-used by applying another layer of opaque material and using the laser beam to expose or ablate new areas. The old opaque material may be removed or left in place.

These above methods of combining precision and non-precision techniques can be used to customize integrated circuits without requiring a customized precision configuration mask. In an embodiment of the present invention, conductive lines and cut points are patterned and etched on a conductive layer. A metal (or other conductive layer) is deposited on a substrate which contains circuit elements and at least one layer allowing connections to the circuit elements to the upper surface of the substrate. The metal layer is patterned using standard precision masking techniques to form a patterned interconnect layer comprising of spaces and conductive lines. The interconnect layer is then coated with a photoresist layer, which can be patterned with the techniques of the present invention described above to form an ASIC blank. The standard precision masks can be made with all possible cut-points for a certain user, general application or other defining characteristic so that many different types of ASICs can be created using one standard cut-point mask. The laser-selected cut points are then etched away to customize the device. After the remaining resist is stripped, the device can be finished by applying a passivation layer and etching pad locations, or further customization can be performed by applying a via layer and depositing another metal layer for etching.

While the previous embodiment requires two patterning operations (one to form the interconnect layer and another to form the possible cut points), another embodiment of the present invention requires only one patterning operation. After the metal layer is deposited on the substrate, a positive resist is formed on the metal layer, and the resist is exposed through a standard mask to define the image of the metal strips. A laser then exposes portions of the resist where additional etching of the underlying metal layer is desired to disconnect selected lines. The resist is developed, so that the portions of the resist exposed through either the standard mask or by the laser beam are removed. Etching is then performed on the uncovered portions of the metal layer. Although this embodiment requires only one masking operation, the accuracy and resolution of the laser beam needs to be higher than with the prior embodiments. In this embodiment, the beam cannot expose adjacent metal lines, but must still expose the entire desired cut points.

In another embodiment of the present invention, customization by selecting desired vias to interconnect layers of a semiconductor device is provided. In this embodiment, an insulator layer, i.e. a dielectric, is formed on a patterned interconnect conductive layer and a layer of photoresist is deposited on the insulator layer. A layer of resist is applied, and the resist is patterned with a standard precision via mask. A laser then selects or de-selects, depending on resist polarity, the desired interconnections. After the resist is developed, the insulator layer is etched to uncover portions of the conductive layer to create vias at the desired locations. The remaining resist is then removed and one or more metal or conductive layers are deposited to fill the vias and to form an upper metal layer, thereby connecting the two metal layers at the desired locations.

In another embodiment, an alternative method is provided for interconnecting layers according to the present invention. After the layer of resist is patterned with the precision mask, the resist is developed and the insulator layer is partially etched at all the possible via locations. After the remaining resist is removed, another layer of resist is applied to the insulator layer. A laser then selects or de-selects, according to resist polarity, portions of the resist where vias are desired. After the resist is developed, another partial etching on the insulator layer is performed, resulting in a two-step via, where the laser defines the upper step and the standard via mask defines the lower step. The device can then be finished as before to form the desired interconnections.

In yet other embodiments of the present invention, customization can be accomplished by selectively forming connections within a conductor layer rather than between conductor layers. A metal layer is patterned by conventional methods so that gaps are present in the connecting strips at all possible connection points. Next, an insulator or dielectric layer is deposited on the metal layer. According to one embodiment, a layer of resist is applied to the insulator layer. The resist is exposed through a standard precision mask to define all possible connection points. Next, a laser selects or de-selects, depending on resist polarity, the desired connection points, and the resist is developed to uncover the desired connection points. Etching is then performed to remove the portions of the insulator layer uncovered by the resist. The desired portions of the metal lines can be electrically connected with conventional methods.

In another embodiment, the two resist method can be used to define connections within lines. After exposing a first resist through a standard mask, the resist is developed and the insulator layer is then etched to uncover all possible connection points. After the remaining resist is removed, a second resist layer is applied over the insulator layer. A laser then exposes areas where connections are desired or not desired, depending on the resist polarity. The resist is then developed to uncover the selected connection points. Conventional methods, such as plating, can then be used to form the connections. The remaining resist is then removed and another layer of dielectric can be deposited to insulate exposed gaps within the metal lines.

In the embodiments of the present invention which specify negative resist, image reversal with a positive resist may be used to create a negative image in the resist, thereby accomplishing the same purpose as with the use of negative resist.

A further advantage of the present invention is that the methods provided may be used to improve the repair of integrated circuits. Laser fuses, which are commonly used as repair elements, may be replaced with, for example, potential cut points on lines spaced at the minimum attainable conductor pitch even with larger laser beam spot sizes.

This invention will be more fully understood upon consideration of the detailed description below taken together with the accompanying drawings.

BRIEF DESCRIPTION OF THE DRAWINGS

FIGS. 13–16 are illustrative sectional views representing an alternative method of the present invention for the non-precision lithography step;

FIGS. 17–19 are illustrative sectional views representing steps for customizing a non-precision mask according to one method of the present invention.

Use of the same reference numerals in different figures indicates identical or similar elements.

DETAILED DESCRIPTION OF THE PREFERRED EMBODIMENTS

The present invention provides a method for fabricating a custom integrated circuit (IC) by combining precision and non-precision lithography without the need of a precision configuration mask. The present invention uses standard precision masks to first define all possible connections within an integrated circuit and then uses a laser or other targeting energy source to customize the IC.

Figure 1:
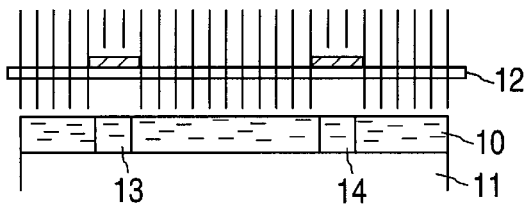
FIGS. 1–3 are illustrative sectional views representing a method of the present invention to pattern photoresist.
Figure 2A:
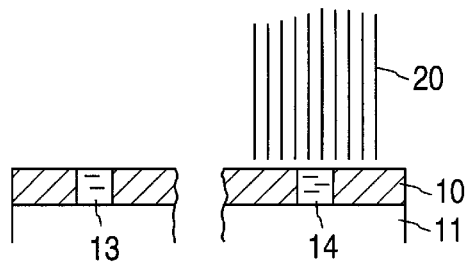
Figure 2B:
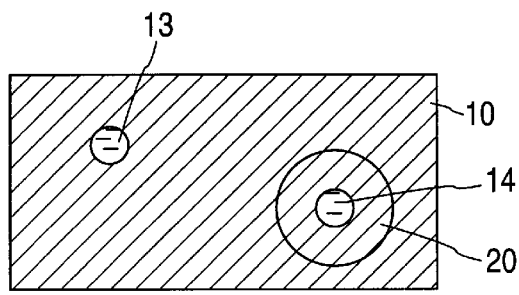
Figure 3:
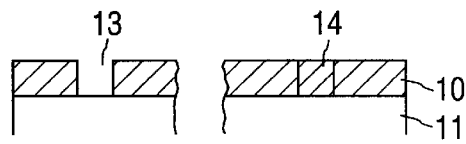

FIGS. 1–3 illustrate one embodiment of the method of the present invention for patterning photoresist. In FIG. 1, a layer of negative polarity photoresist ("resist") 10 is deposited on a wafer structure 11 or any other surface to be acted upon after the resist is patterned. Resist 10 is then exposed by a light source through a standard precision mask 12 or by other precision techniques. Standard mask 12 is opaque at all the possible resist openings for a general use or for a particular user, leaving all possible openings on resist layer 10 unexposed. While many possible openings normally exist, FIG. 1 shows only two possible openings 13 and 14 for illustrative purposes.

A non-precision laser direct-write machine or other targeting energy beam system 20 (hereinafter referred to generally as "laser") then exposes the possible openings defined with the standard mask which are to remain protected by resist 10. In FIGS. 2A and 2B, representing respective side and top views, possible opening 14 is exposed by laser beam 20, which is typically, but not necessarily, larger than the dimensions defined by standard mask 12. Resist 10 is then developed to uncover desired opening 13, as shown in FIG. 3. Structure 11 may then be etched, implanted or otherwise acted upon with the pattern of the selected openings defined by resist 10.

Openings are defined in this manner by a logical NOR of a precision exposure (e.g., reduction stepper with standard precision masks) and a laser exposure, where the size of the openings are defined with the smaller of the exposure steps, typically the precision exposure. The selection of the openings are then determined by the laser exposure. The order of the two exposure steps may also be reversed. Regardless of the order, the laser beam radius, as seen from FIG. 2B, can be approximately equal to the minimum center-to-center distance between opening placements—½*minimum opening dimension—registration difference between two exposure steps without affecting other openings. This method allows the density of the stepper system to be maintained while allowing a zero mask-cost configuration of the laser system for manufacturing. Furthermore, the amount of data to be written and the pixel density requirements for the laser system may be reduced, thereby reducing both the time and cost to process a device when compared to an entirely laser-based approach.

Figure 4:
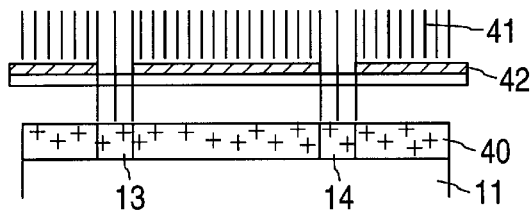
FIGS. 4–6 are illustrative sectional views representing another method of the present invention to pattern photoresist.
Figure 5A:
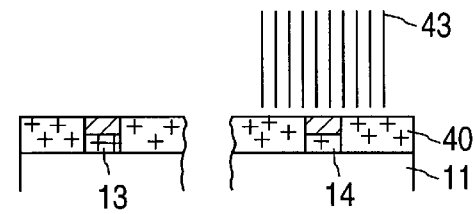
Figure 5B:
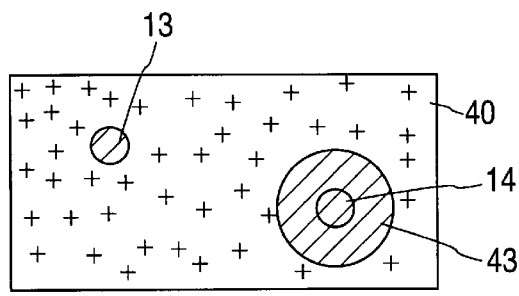
Figure 6:
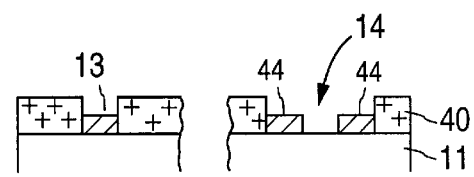

FIGS. 4–6 illustrate another embodiment of the present invention using a logical AND for patterning positive resist. In FIG. 4, a layer of positive resist 40 is deposited on structure 11. Resist 40 is exposed by a light source 41 through a precision mask 42 to define all possible openings 13 and 14. Exposure by light source 41 is kept below the clearing energy of resist 40, i.e., the amount of energy required to fully develop the resist. A laser 43 then exposes desired opening 14 to fully expose opening 14, as shown in respective side and top views, FIGS. 5A and 5B. The energy of the laser exposure step is similarly kept below the clearing energy of resist 40. However, the combined energy of light source 41 and laser 43 is at least the clearing energy, and therefore sufficient for complete resist development. FIG. 6 shows the area which was exposed by both exposure steps developed to uncover opening 14. Possible opening 13 and area 44, which were exposed by only one exposure step, remain covered with resist 40. Structure 11 may then be etched, implanted, or otherwise acted upon with the pattern of the selected openings defined by the logical AND of the mask and the laser patterns.

As with the previous embodiment, the size and shape of the desired openings are defined by the precision mask, while the openings are selected by the laser. The exposure steps can similarly be reversed. However, while the allowable laser beam diameter is the same as for the previous embodiment, the exposure requirements for the laser and mask are stricter. Specifically, the exposure time and energy must be controlled such that each exposure step by itself does not exceed the clearing energy of the resist. On the other hand, an advantage of this method is that a dark-field precision mask can be used, which is less sensitive to contamination causing defects. Furthermore, the ability to use positive resist may eliminate the need to add a negative resist process to the manufacturing line, which is a further advantage.

Figure 7:
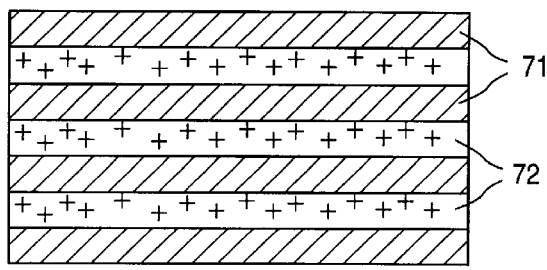
FIGS. 7–9 are illustrative sectional views representing a method of the present invention to pattern resist line spaces.
Figure 8:
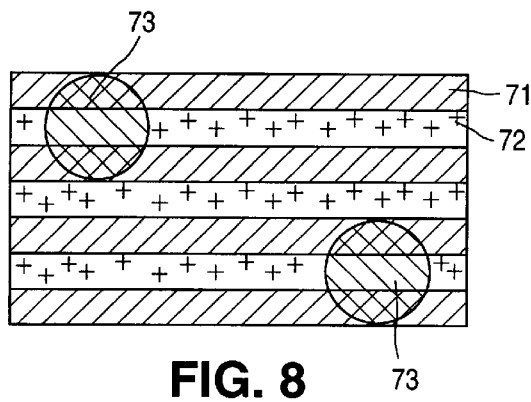
Figure 9:
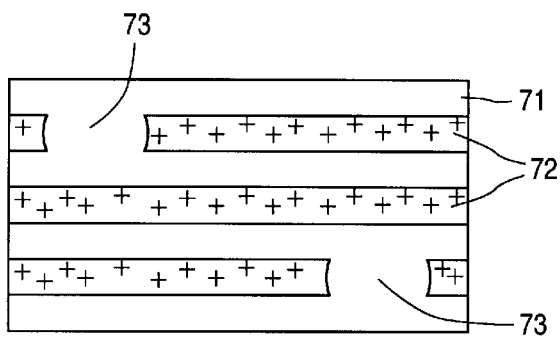

FIGS. 7–9 illustrate an embodiment of the present invention for patterning lines and selected gaps within lines on a positive resist layer. In FIG. 7, a layer of positive resist is deposited over a structure (not shown) to be patterned. The resist is exposed through a precision mask or other precision technique to define spaces 71 (exposed areas) and lines 72 (unexposed areas). A laser then exposes gaps 73 within lines 72, as shown in FIG. 8. The resist is developed to remove areas exposed by the precision mask or the laser, resulting in the desired pattern of spaces 71 and gaps 73 uncovered by resist and lines 72 covered by resist, as shown in FIG. 9. The structure may then be etched or acted upon with the pattern of the selected spaces and gaps defined by the logical OR of the mask and the direct-write patterns. The dimensions of the spaces and lines are determined by the precision step, while the gaps within the lines are determined by the laser step, with the order of steps interchangeable. The diameter of the laser beam can be approximately 2*space dimension+line dimension−2*registration difference between the two exposure steps without affecting adjacent lines, as seen from FIG. 8.

Figure 10:
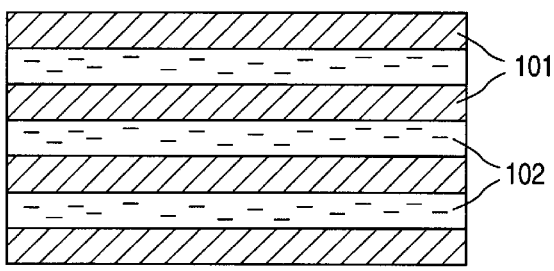
FIGS. 10–12 are illustrative sectional views representing another method of the present invention to pattern resist line spaces.
Figure 11:
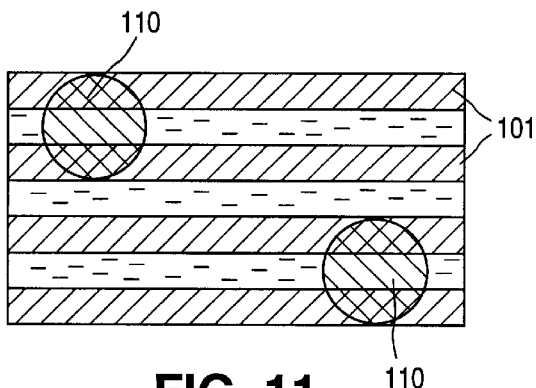
Figure 12:
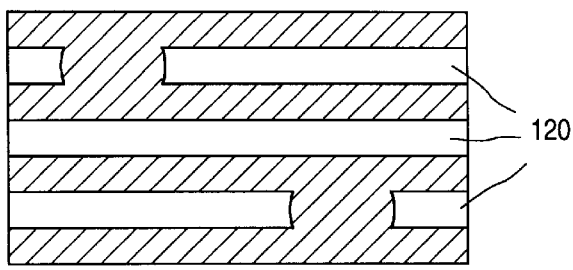

FIGS. 10–12 illustrate an embodiment of the present invention to pattern lines and connections between lines on negative photoresist. FIG. 10 shows a layer of negative resist applied over a structure (not shown) to be patterned. The resist is exposed through a precision mask to define lines 101 where the resist is to cover the structure and to define spaces 102 where the resist is to be removed. A laser then exposes areas 110 between lines 101 where additional resist is desired to cover the structure, as shown in FIG. 11. The resist is developed and areas 120 of the resist left unexposed by the mask or laser are removed, resulting in the pattern in FIG. 12. Unexposed areas 120, defined by the logical NOR of the mask and the laser pattern, can then be etched or otherwise acted upon. The lines and spaces are defined by the precision step and the additional resist or connections between the lines are defined by the non-precision laser step, where the performance order of the steps can be reversed if desired. The diameter of the laser exposure can be approximately 2*line dimension+space dimension−2*registration difference between the two exposure steps without affecting adjacent spaces.

Whereas the above embodiments use one resist layer, FIGS. 13–16 illustrate an embodiment using two resist layers for patterning a device. A layer of resist is exposed through a precision mask and developed to uncover all possible openings. The resist can be negative or positive, accompanied with a corresponding change to the polarity of the mask, as shown in FIGS. 1 and 4, respectively. FIG. 13 shows a resist 130 with possible openings 13 and 14 after resist 130 is developed and hardened if desired. Another layer of resist 140, which can be positive or negative, is deposited over resist 130 and openings 13 and 14, as shown in FIG. 14. A laser 141 then exposes resist 140 in an area surrounding opening 14. In FIG. 15, resist 140 is positive. After laser 141 exposes desired opening 14, resist 140 is developed to uncover opening 14. Alternatively, resist 140 can be negative as shown in FIG. 16. After laser 141 exposes openings 14 to be covered, resist 140 is developed to uncover desired opening 13 while leaving a resist plug over opening 14. The structures in FIGS. 15 and 16 can then be etched or otherwise acted upon based on the patterned resist.

If both steps use the same polarity resist, the redundancy of the resist layers can help reduce the defect density and allows the use of a thinner resist layer for the precision lithography step without compromising total resist thickness, which protects against etch erosion in areas of the circuit more than one-half the laser spot size away. The reduction in resist thickness can be used to tailor the contour of subsequent etchings of the openings. However, if the two steps use different polarity resists, the precision lithography step can be optimized for size control and manufacturing ease, and the polarity of the direct-write step can be chosen separately to minimize the amount of data to be written, i.e., choose the resist polarity requiring the least amount of laser exposures. As a result, throughput is increased and the cost of the direct-write step is reduced.

This two resist method can be similarly used in the non-precision steps for the embodiments of FIGS. 10–12 discussed above. Furthermore, this method can be used whereby the first and/or second resist layers need not be kept during the entire processing step. For instance, either lithography step (precision or non-precision) may create a resist pattern which is transferred by etch, implantation or other technique to an underlying layer. The first resist can then be removed, with the underlying pattern taking the place of the first resist. The second resist is deposited and the structure subsequently processed.

Although the description of these embodiments use optical reduction steppers and laser machines, they are equally applicable to any precision lithographic system used in conjunction with any direct-write system. It will also be understood by one skilled in the art that a negative resist process can be replaced with a positive resist process with image reversal to achieve the same results. Additionally, the processes defined with single develop steps may be replaced with multiple develop steps for positive resist processing.

In the above described methods, a laser is used to select desired openings in the resist. Alternatively, rather than using a laser beam to expose the resist, irradiation through a laser-manufactured non-precision mask can also be used. FIGS. 17–19 illustrate one way to manufacture and use such a mask. In FIG. 17, a mask blank 170 is covered with an opaque material 175, which is covered by a positive or negative resist layer 177. A laser 180 then exposes desired portions of resist layer 177, and the selected portions of the resist and opaque layers are removed using conventional methods. After the remaining resist 177 is removed, mask 185 is formed as shown in FIGS. 18A and 18B. An alternative method of forming mask 185 uses direct ablation by a laser to remove opaque material 175, thereby eliminating the need for a resist layer. Mask 185 can then be used in place of the laser step in the previous embodiments for patterning the resist, as shown in FIG. 19 for example.

Using laser manufactured non-precision configuration masks provides many advantages not found in using a laser beam directed on the resist layer. Using a configuration mask to select resist openings or connections allows an entire integrated circuit or a series of integrated circuits to be exposed at once, thereby greatly reducing the time spent at the exposure step, increasing the throughput, and reducing manufacturing costs when large volumes of units are required. In addition, laser use is greatly reduced because the laser beam is needed only to manufacture a configuration mask rather than to directly expose patterns on each integrated circuit. For example, if five hundred openings are required to customize or pattern an IC, it would require five million laser pulses to manufacture ten thousand devices of this design. However, if a non-precision configuration mask of the present invention is used, only five hundred laser pulses are needed to produce the same number of devices.

The non-precision configuration mask provides additional advantages. Because of the reduced dimension control, registration, and volume of data requirements, the non-precision configuration mask is much less costly and time-consuming to manufacture than precision configuration masks, which results in a reduction of the per design fixed costs for the manufacture of the end units. The non-precision nature of the mask also reduces the requirements, and therefore the cost, of the reduction stepper (or aligner) used to apply the image of the configuration mask to the resist. Using, preferably, an older and less costly generation stepper with lower resolution capability than that of the standard precision masks allows the laser manufactured non-precision mask to be less precisely made because small imperfections in the edge definition of the mask and small splatters of debris or foreign matter will not be resolved onto the resist. As a result, the susceptibility to defects in the manufacture of the mask or to later contamination during storage or use of the mask is reduced. Time and costs can be further reduced because the masks can be re-used by simply removing the old layer of opaque material, then applying a new layer of opaque material and forming the new desired exposure points to create a new configuration mask. The following description uses the above-described methods to customize integrated circuits at various processing steps.

Figure 20:
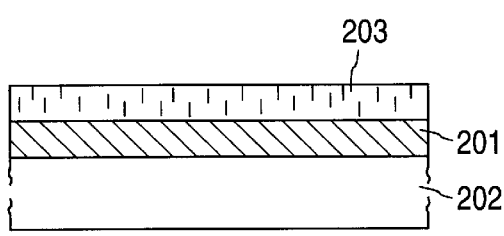
FIGS. 20–24B are illustrative sectional views representing the various steps for customizing an integrated circuit according to one method of the present invention by etching cut points.
Figure 21:
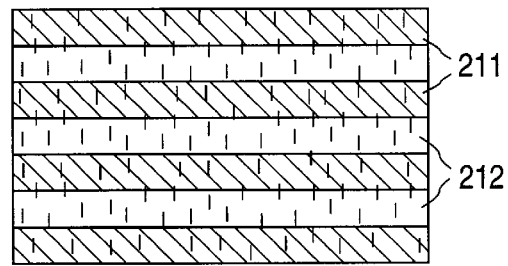
Figure 22:
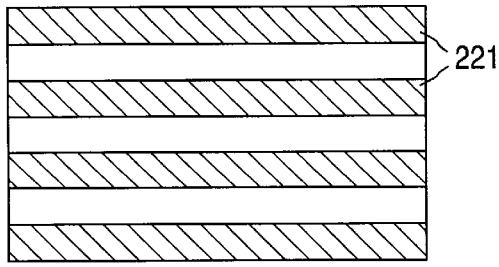

FIGS. 20–24B illustrate customizing a gate array by patterning cut points according to the present invention. In FIG. 20, a metal layer 201, to be customized, is deposited on a substrate 202 and a layer of photoresist (positive or negative) 203 is then formed on metal layer 201. Substrate 202 includes circuit elements, such as logic gates or transistors, and may include additional conductive or connector layers, contact layers or insulation layers. Metal layer 201 provides contact with these lower layers and circuit elements. Resist 203 is then exposed through a standard mask by intense light to form a patterned interconnect layer comprising lines 211 and spaces 212, as shown in a top view in FIG. 21. Next, resist 203 is developed to remove the selected areas of resist 203 (exposed portions if positive resist, unexposed portions if negative resist), uncovering portions of metal layer 201. Metal layer 201 is then etched and the remaining resist is removed. Thus, the surface of the substrate is now covered by metal connection lines 221 to be customized, as shown in FIG. 22.

Figure 23A:
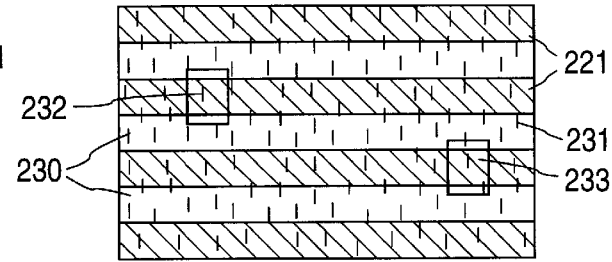
Figure 23B:
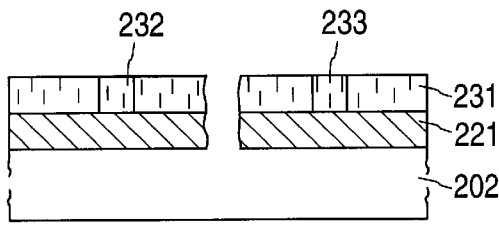
Figure 24A:
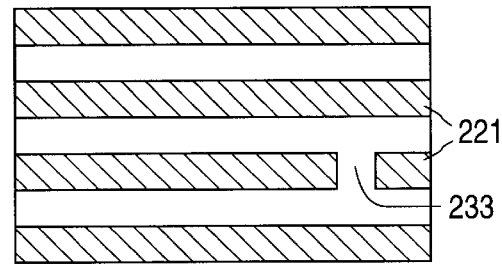
Figure 24B:
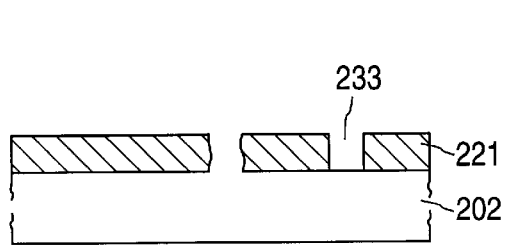

In FIGS. 23A and 23B, a layer of resist 231 is applied over metal connection lines 221 and spaces 230 over substrate 202 and then patterned with a precision cut-point mask, using methods discussed with respect to FIGS. 1 or 4 to define desired cut points 232 and 233. This structure forms an ASIC blank, which can now be customized with one of the non-precision steps discussed above. Metal connection lines 221 are then etched through the selected openings of the resist, followed by removal of the remaining resist, as shown in FIGS. 24A and 24B, leaving a customized metal layer with cut point 233 etched.

At this point, a planarization or passivation layer may be applied, the pad locations are etched, and the device is therefore completely formed. Alternatively, an insulation layer may be applied, via locations are then etched, and one or more metal or conductive layers can be deposited and patterned using the method of the present invention or standard masking techniques, followed by passivation and pad masking.

Figure 25:
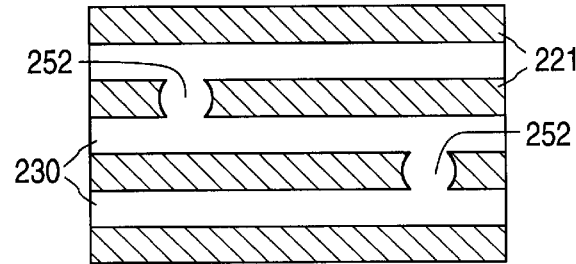
FIG. 25 is a top view of a customized cut point device utilizing the method of FIGS. 7–9.

Cut points within conducting lines can also be etched with a single etching step according to the method of FIGS. 7–9. A positive resist is deposited on a metal or other conducting layer and patterned with a precision mask, as in FIG. 7, forming an ASIC blank. After patterning the resist with a non-precision configuration step, spaces 230 and gaps 252, uncovered by the resist, are etched, and the remaining resist is removed, as shown in FIG. 25. The advantage of this method is that a standard cut point mask is not needed, thereby saving both cost and cycle time for producing an ASIC. However, contrary to the prior methods, this method requires that the laser beam be more accurate so that the beam does not expose adjacent lines in metal lines 221, where the beam size is limited to the diameter provided above with respect to FIGS. 7–9.

Figure 26:
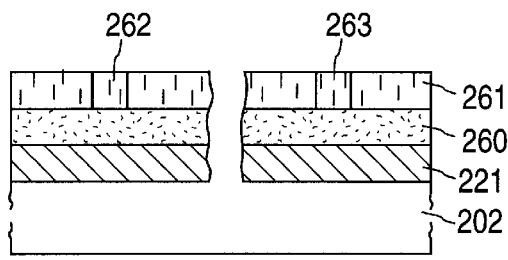
FIGS. 26–28B are illustrative sectional views representing steps for customizing an integrated circuit according to another method of the present invention by etching vias.
Figure 27:
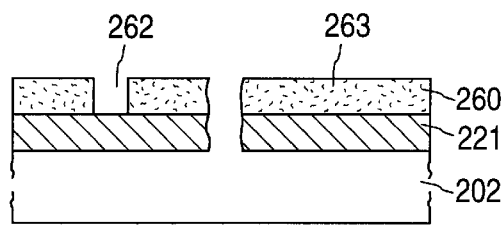
Figure 28A:
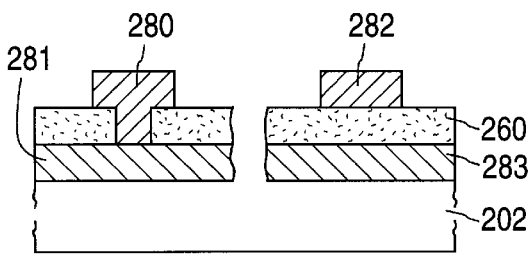
Figure 28B:
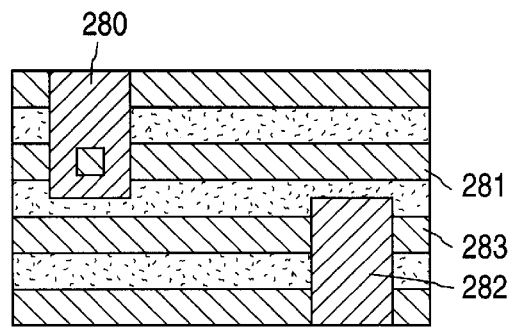

FIGS. 26–28B illustrate interconnecting two metal or conductive layers according to the present invention. In FIG. 26, a layer of dielectric or other insulating material 260 is deposited on a metal or conductive layer, which has been patterned with metal interconnection lines 221 using conventional techniques to form a patterned interconnect layer. Furthermore, FIG. 26 shows a resist 261 (positive or negative) deposited on dielectric layer 260, which has been exposed through a standard precision via mask to define all possible via locations 262 and 263 using methods discussed above. The device formed is an ASIC blank that can now be customized with a non-precision step. After the desired via locations are selected with the non-precision step, dielectric layer 260 is etched to uncover desired via location 262 on metal lines 221 and the remaining resist removed, as shown in FIG. 27. A second metal or conductive layer is deposited and patterned to form the desired connections. FIGS. 28A and 28B are respective side and top views showing a second metal layer line 280 connected to a first metal layer line 281 of lines 221 and a second metal layer line 282 insulated from first layer metal line 283 of metal lines 221.

Figure 29:
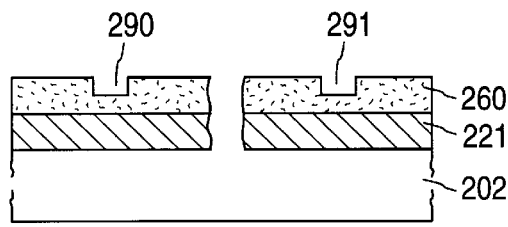
FIGS. 29–31B are illustrative sectional views representing steps for customizing an integrated circuit according to another method of the present invention by etching vias.
Figure 30A:
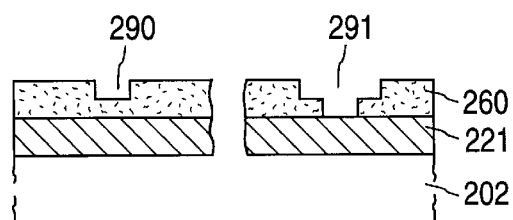
Figure 30B:
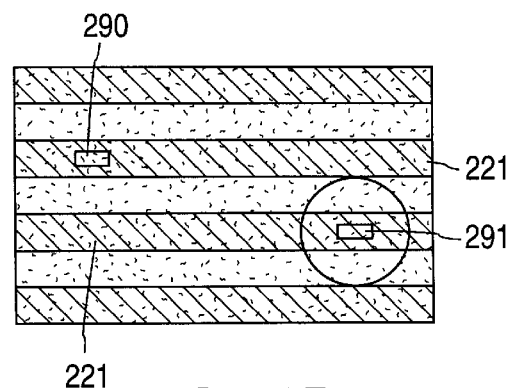
Figure 31A:
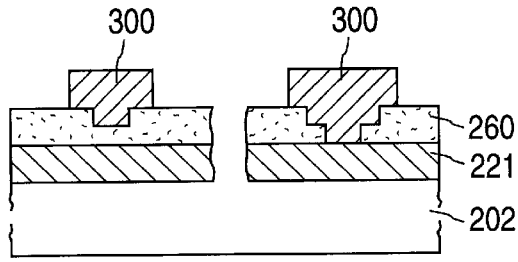
Figure 31B:
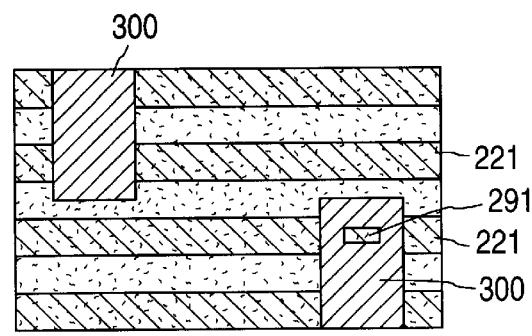

FIGS. 29–30B show an alternative method for interconnecting layers according to the present invention. In FIG. 29, dielectric layer 260 is partially etched at possible via locations 290 and 291 defined by a standard precision via mask and the remaining portions of resist are subsequently removed. After another layer of resist is deposited over dielectric layer 260, a non-precision laser selects the desired interconnections. After the resist is developed so that openings are provided at the uncovered portions, dielectric layer 260 is etched to metal lines 221 at via location 291 but not via location 290, resulting in a two-step via, in which the laser defines the upper step and the standard precision via mask defines the lower step. The remaining portions of the resist are then removed, resulting in the device shown in FIGS. 30A and 30B. FIGS. 30A and 30B show connection point 291 formed by an opening through dielectric 260 to metal connection lines 221 while possible connection point 290 remains insulated. Another metal layer 300 can then be deposited and patterned to form the desired interconnections, as shown in FIGS. 31A and 31B. This method has the additional advantage of reducing line capacitance because the two-step vias accommodate a thicker dielectric thickness over areas not adjacent to the vias without violating the via step height and aspect ratio limitations of a given process technology.

According to another aspect of the present invention, connections can be formed within each layer, rather than between layers, to customize integrated circuits. FIGS. 32–40 illustrate two alternative methods. In FIGS. 32–36B all possible connection points are initially covered by a dielectric layer, whereas in FIGS. 37–40, all possible connection points are initially exposed by etching the dielectric layer.

Figure 32:
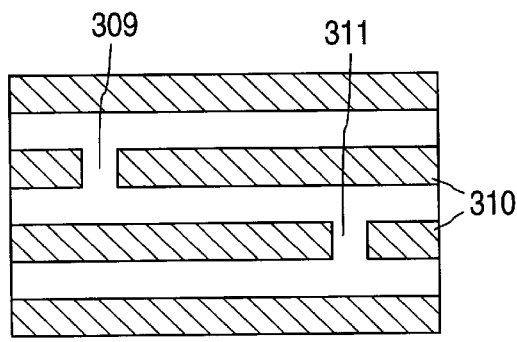
FIGS. 32–36B are illustrative sectional views representing steps for customizing an integrated circuit according to another method of the present invention by forming connections within a layer.
Figure 33:
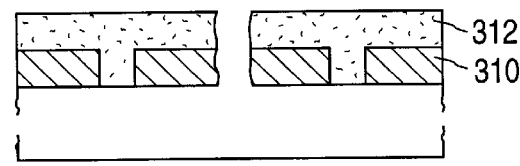

FIG. 32 shows a top view of a metal or conductive layer deposited on an insulating layer to provide connections with the circuit elements in other layers of the semiconductor structure. The metal layer is patterned to provide metal lines 310 with gaps 309 and 311 at all possible connection points to form a patterned interconnect layer. A dielectric 312 is then deposited on the metal lines 310, as shown in FIG. 33.

Figure 34:
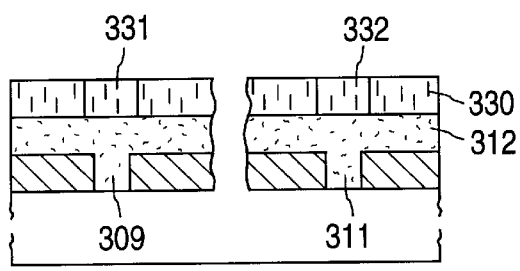
Figure 35:
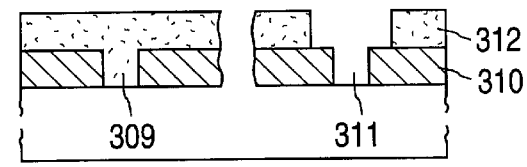
Figure 36A:
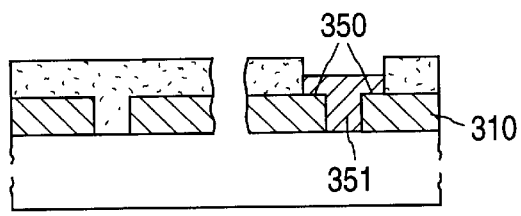
Figure 36B:
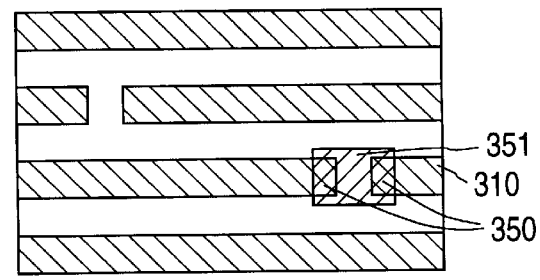

In FIG. 34, a layer of resist (positive or negative) 330 is then provided on dielectric layer 312 and exposed through a standard precision mask to define openings at all possible connection points 309 and 311, e.g. potential openings 331 and 332, to form an ASIC blank. A laser beam is used to select area 332 of resist 330 above connection point 311 which is to be connected. In FIG. 35, resist layer 330 is developed, dielectric layer 312 is then etched to uncover the desired connection point 311 while leaving possible connection point 309 insulated. Then, the remaining portions of resist 330 are removed. In FIGS. 36A and 36B, uncovered ends 350 of metal line 310 are bridged by a conductive material 351 to form the desired connections. The conductive material can be provided by plating, for example. Other conventional connection techniques may also be used.

Figure 37:
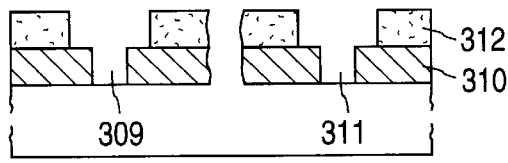
FIGS. 37–40 are illustrative sectional views representing steps for customizing an integrated circuit according to another method of the present invention by forming connections within a layer.
Figure 38:
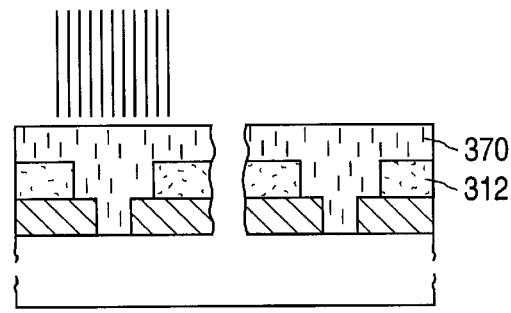
Figure 39:
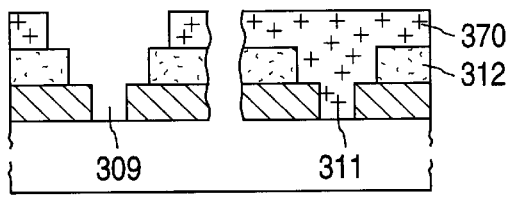
Figure 40:
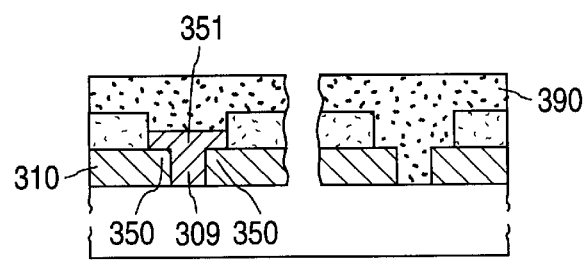

FIGS. 37–40 illustrate connecting metal strips within a layer according to the present invention using the method of two resists. After the step shown in FIG. 34, resist 330, which can be positive or negative, is developed to create openings above all possible connection points 309 and 311. Dielectric layer 312 is then etched to uncover the possible connection points 309 and 311. The remaining portions of resist 330 are then removed, as shown in FIG. 37. In FIG. 38, another layer of positive or negative resist 370 is deposited on dielectric layer 312, and a laser exposes resist 370 in areas above where connections are desired (positive resist) or where connections are to remain open (negative resist). Resist 370 is then developed to remove the portions of resist 370 selected by the laser step. In FIG. 39, positive resist is used so that connection point 309 is uncovered and possible connection point 311 remains protected by resist 370. The uncovered ends 350 of metal line 310 are bridged by a conductive material 351 to form a connection at point 309, resist 370 is removed, and another dielectric layer 390 may be deposited, as shown in FIG. 40.

The present invention offers several advantages over previous methods of customizing integrated circuits. Because no precision configuration mask is required for each different customization, both the cost and lead-time to produce an application-specific integrated circuit (ASIC) are reduced. In the present invention, the only precision masks required are those used to form the ASIC blank which is then available for use by a large number of possible designs. ASIC blanks can be stored until they are ready to be customized, which then only requires a laser beam to selectively define the desired areas to be connected or disconnected. Prior methods require manufacturing precision configuration masks for each new design, which greatly increases the cost and latency between the time the user provides the design to the manufacturer and the time the user receives the ASIC. Therefore, per design costs and the time to delivery are reduced. Furthermore, since the time required to prepare for the actual customization of the die is now only the time needed to determine the coordinates and control signals for the laser machine, near instantaneous release of the design to the production facility is possible when compared to the time required to manufacture and check a precision configuration mask. In addition, the per design expense of the precision configuration masks are eliminated.

Additionally, the production of small numbers of units becomes economically feasible with the present invention. Often the need to check system designs with actual working ICs leads to the need for prototype units to be built in very small quantities, often two dozen or less. The present invention allows this to be done economically by both eliminating the need for precision configuration masks and allowing multiple custom devices to be built on the same wafer. Previous methods which required the production of one or more precision configuration masks for each design would require that large numbers of units be produced in order for the per-design mask purchase costs to amortize down to reasonable per unit costs. The present invention allows for designs to be implemented without such costs and the need to amortize them, such that production of very small lot quantities, including quantities of less than a full wafer, become economical.

An alternative use of laser beams in the industry is to use lasers to blast connecting links between circuits (laser fuses) allowing customization or repair of circuitry. The present invention has advantages over this previous method in that the energy delivery to the wafer by the laser beam is very low. Consequently, cut points or connection points in the present invention can be placed above active circuitry in contrast to laser fuses of previous techniques, which dictate that circuitry or conductors lie outside the laser beam diameter in order to avoid damage. The methods described above further eliminate problems associated with laser fuses. Common repair practices include using laser-blown fuses, laser-connected antifuses or electrically programmed bits to control the deactivation of defective circuit sections and the activation of replacement circuit sections. Using methods of the present invention, activation and deactivation can be controlled by conductors, which may be selectively connected or disconnected for each specific IC to effectuate repairs within a smaller die area and with a tighter pitch between elements than with prior techniques. With prior methods, laser fuses and conductors, which carry signals in and out of the fuses, must be separated from one another by more than the minimum pitch of the conductor layer on which they are formed because current resolution of laser spot sizes are below the dimensions of lines and spaces formed through precision masking techniques. The present invention eliminates this problem by allowing laser fuses to be replaced with, for example, potential cut points on lines spaced at the minimum attainable conductor pitch, regardless of the laser beam size.

The present invention also reduces cost of the laser machine due to the lower energy delivery and the less exacting energy delivery controls needed to avoid wafer damage. The cost of the laser machine may also be reduced because the spot size requirements are less restrictive in the present invention than previous methods utilizing laser fuses. This is because the only area affected by the beam is defined by the overlap of the standard precision cut-point mask and the area exposed (or not) by the laser beam. The dimensions of this overlap are therefore determined by the dimensions of the precision cut-point mask rather than the laser beam size.

The detailed description is provided above to illustrate specific embodiments of the present invention and is not intended to be limiting. Numerous modifications and variations are possible within the scope of the present invention. For example, these techniques are not limited to production of ASICs, but apply to any photo-defined process requiring the alteration of the photo-defined areas beyond one standard pattern. Other applications of these techniques include the production of read-only memories (ROMs), the selection of alternative modes of operation of standard devices, and the repair of memory or logic circuits. The present invention is defined by the appended claims.

What is claimed is:

1. A method for customizing or repairing integrated circuits comprising:

providing a substrate in which circuit elements have been formed, said circuit elements having connection points provided at an upper surface of the substrate;

forming a patterned interconnect layer over said upper surface of the substrate;

depositing a positive photoresist layer over said patterned interconnect layer;

exposing said photoresist layer to define possible cut points on said patterned interconnect layer;

exposing said photoresist layer to define desired cut points; and developing and removing said first photoresist to uncover the desired cut points on said patterned interconnect layer, and etching said patterned interconnect layer at the desired cut points, wherein a light exposure through a standard cut-point mask is used to define said possible cut points on the patterned interconnect layer by exposing all possible cut points with an energy less than a clearing energy of said photoresist, and wherein a non-precision technique is used to define desired cut points by exposing said photoresist layer with an energy less than the clearing energy of said photoresist, the non-precision technique energy when combined with the standard cut-point mask exposure energy being at least the clearing energy of said photoresist.

2. The method of claim 1, wherein the defining possible cut points follows the defining desired cut points.

3. The method of claim 1, wherein the non-precision technique is exposure with a targeting energy beam.

4. The method of claim 1, wherein the non-precision technique is exposure through a non-precision mask.

5. A method for customizing or repairing integrated circuits comprising:

providing a substrate in which circuit elements have been formed, said circuit elements having connection points provided at an upper surface of the substrate;

forming a patterned interconnect layer over said upper surface of the substrate;

depositing a first photoresist layer over said patterned interconnect layer;

exposing said first photoresist layer to define first cut points on said patterned interconnect layer;

developing and removing the first photoresist layer at the first cut points, and depositing a second photoresist layer over the first photoresist layer;

exposing said second photoresist layer to define second cut points; and developing and removing said second photoresist to uncover the second cut points on said patterned interconnect layer, and etching said patterned interconnect layer at the second cut points.

6. The method of claim 5 wherein light exposure through a standard cut-point mask is used to define the first cut points, wherein the first cut points are possible cut points and the second cut points are desired cut points.

7. The method of claim 6 wherein exposure by a targeting energy beam is used to define the second cut points.

8. The method of claim 5, wherein said first and second photoresist are of same polarity.

9. The method of claim 5, wherein said first and second photoresist are of opposite polarity.

10. The method of claim 5, wherein the first cut points are desired cut points and the second cut points are possible cut points.

11. The method of claim 5, wherein the first cut points are possible cut points and the second cut points are desired cut points.

* * * * *